United States Patent
Takakuwa (10) Patent No.: US 8,765,034 B2
(45) Date of Patent: Jul. 1, 2014

(54) PATTERN FORMATION METHOD, PATTERN FORMATION APPARATUS, AND RECORDING MEDIUM RECORDED WITH ALIGNMENT PROGRAM

(71) Applicant: Kabushiki Kaisha Toshiba, Tokyo (JP)

(72) Inventor: Manabu Takakuwa, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/767,234

(22) Filed: Feb. 14, 2013

(65) Prior Publication Data
US 2014/0071413 A1    Mar. 13, 2014

(30) Foreign Application Priority Data
Sep. 7, 2012  (JP) ................................. 2012-197807

(51) Int. Cl.
*B29C 59/02* (2006.01)

(52) U.S. Cl.
USPC .......... 264/40.1; 264/293; 264/494; 264/496; 264/406; 264/408; 425/174.4; 425/150; 425/385; 425/169; 425/171

(58) Field of Classification Search
USPC ................ 264/293, 40.1, 494, 496, 406, 408; 425/174.4, 150, 385, 169, 171; 977/887
See application file for complete search history.

(56) References Cited

U.S. PATENT DOCUMENTS

| 7,281,921 B2 | 10/2007 | Watts et al. |
| 2010/0104984 A1 | 4/2010 | Shiobara et al. |
| 2011/0278768 A1 | 11/2011 | Sato |

FOREIGN PATENT DOCUMENTS

| JP | 9-190972 | 7/1997 |
| JP | 2010-186918 | 8/2010 |

*Primary Examiner* — Joseph S Del Sole
*Assistant Examiner* — Lawrence D Hohenbrink, Jr.
(74) *Attorney, Agent, or Firm* — Finnegan, Henderson, Farabow, Garrett & Dunner, L.L.P.

(57) ABSTRACT

According to one embodiment, a pattern formation method includes placing a master on a substrate including a concave-convex pattern, performing alignment between the master and the substrate, curing a photosensitive resin applied onto the substrate, with the pattern brought into contact with the resin, and removing the master from the resin. The performing alignment includes measuring amount of misalignment of first marks provided at least three of four corners of the shot region and performing alignment of the corners, after the alignment of the corners, measuring misalignment of a second mark, calculating a target value of amount of movement of the corners so as to minimize the amount of misalignment of the first marks and amount of misalignment of the second mark, and performing alignment between the master and the substrate so that the amount of movement of the corners is made close to the value.

14 Claims, 6 Drawing Sheets

PATTERN FORMATION METHOD, PATTERN FORMATION APPARATUS, AND RECORDING MEDIUM RECORDED WITH ALIGNMENT PROGRAM

CROSS-REFERENCE TO RELATED APPLICATIONS

This application is based upon and claims the benefit of priority from the prior Japanese Patent Application No. 2012-197807, filed on Sep. 7, 2012; the entire contents of which are incorporated herein by reference.

FIELD

Embodiments described herein relate generally to a pattern formation method, a pattern formation apparatus and a recording medium recorded with alignment program.

BACKGROUND

As one of the pattern formation methods for forming a fine pattern, the imprint method has been drawing attention. The imprint method uses a master (mold) provided with the concave-convex shape of a pattern to be transferred. In the imprint method, a photocurable resin is applied onto a substrate to which the pattern is to be transferred. Then, the concave-convex shape of the is brought into contact with this resin. In this state, the resin is cured. Subsequently, the master is removed from the resin. Thus, the concave-convex shape of the master is transferred to the resin. In such a pattern formation method, it is important to improve the accuracy of alignment between the master and the substrate.

DETAILED DESCRIPTION

In general, according to one embodiment, a pattern formation method includes placing a master on a substrate, the master including a concave-convex pattern formed in a rectangular shot region. The method includes performing alignment between the master and the substrate. The method includes curing a photosensitive resin applied onto the substrate, with the concave-convex pattern of the master brought into contact with the photosensitive resin. The method includes removing the master from the photosensitive resin. The performing alignment includes measuring amount of misalignment of first alignment marks provided at least three of four corners of the shot region with respect to a fiducial on the substrate, and performing alignment of the four corners of the shot region. The performing alignment includes after the alignment of the four corners of the shot region, measuring misalignment of a second alignment mark provided at other than the four corners of the shot region with respect to a fiducial on the substrate. The performing alignment includes calculating a target value of amount of movement of the four corners of the shot region so as to minimize the amount of misalignment of the first alignment marks and amount of misalignment of the second alignment mark. The performing alignment includes performing alignment between the master and the substrate so that the amount of movement of the four corners of the shot region is made close to the target value.

Various embodiments will be described hereinafter with reference to the accompanying drawings. In the following description, like members are labeled with like reference numerals. The description of the members once described is omitted appropriately.

First Embodiment

Figure 1:
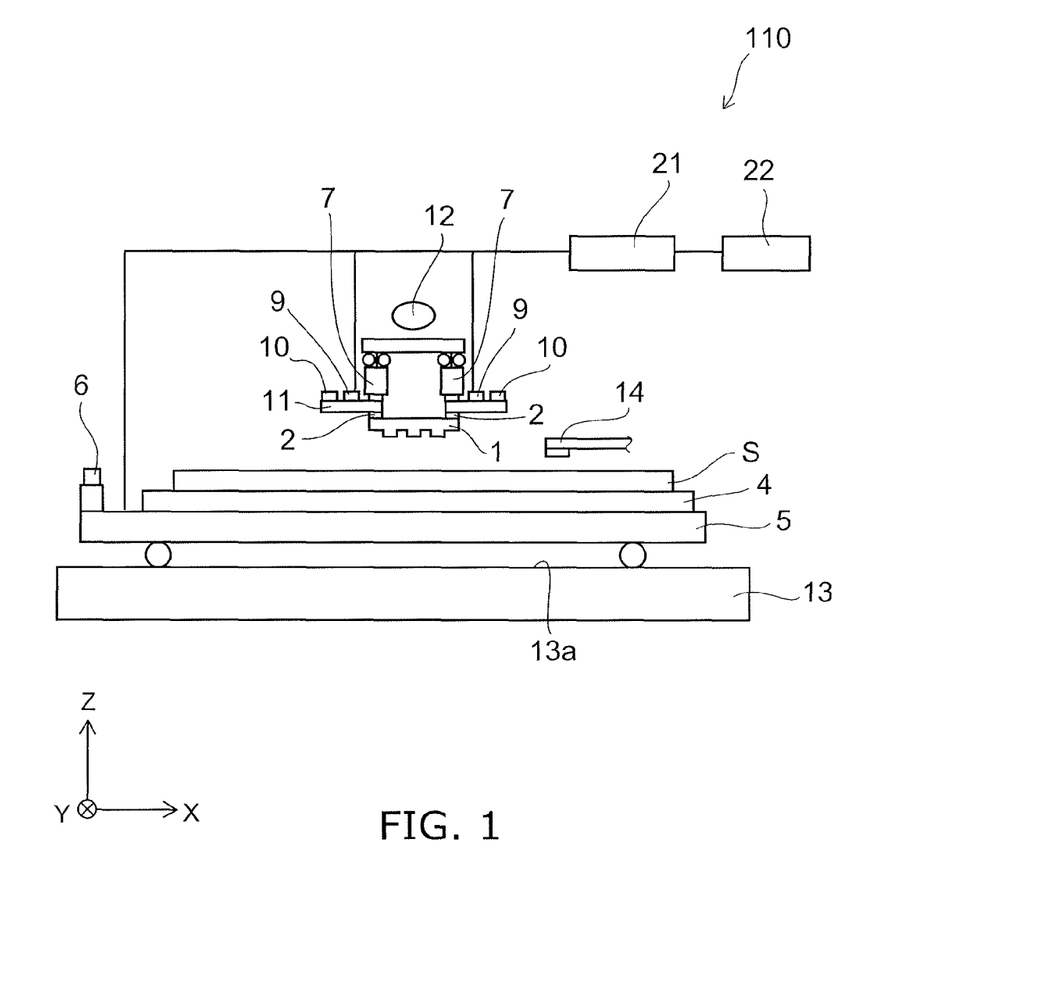
FIG. 1 is a schematic view illustrating the configuration of a pattern formation apparatus according to a first embodiment.

FIG. 1 is a schematic view illustrating the configuration of a pattern formation apparatus according to a first embodiment.

As shown in FIG. 1, the pattern formation apparatus 110 includes a master stage 2, a sample stage 5, a correction mechanism 9, a control calculation unit 21, and a light source 12. The pattern formation apparatus 110 further includes an alignment sensor 7 and an alignment stage 8. The pattern formation apparatus 110 according to the embodiment is an imprint apparatus for transferring the concave-convex pattern of a master 1 to a resin on a substrate S.

On the sample stage 5, a chuck 4 is provided. The chuck 4 holds the substrate S. The substrate S is a target in which the pattern is to be formed. For instance, the chuck 4 holds the substrate S by vacuum suction. The sample stage 5 is provided on a stage platen 13.

The substrate S includes a substrate such as a semiconductor substrate, a foundation pattern formed on this substrate, and a target layer (to-be-processed layer) formed on this foundation pattern. At the time of pattern transfer, the substrate S further includes a photosensitive resin formed on the target layer. The target layer can be an insulating film, a metal film (conductive film), or a semiconductor film.

The sample stage 5 is movably provided on the stage platen 13. The sample stage 5 is provided so as to be movable along two axes along the upper surface 13a of the stage platen 13. Here, the two axes along the upper surface 13a of the stage platen 13 are referred to as X axis and Y axis. The sample stage 5 is provided so as to be movable also along the Z axis orthogonal to the X axis and the Y axis. Preferably, the sample stage 5 is provided so as to be rotatable about each of the X axis, the Y axis, and the Z axis.

The sample stage 5 is provided with a fiducial mark support 6. On the fiducial mark support 6, a fiducial mark (not shown) serving as a fiducial position of the apparatus is placed. The fiducial mark is made of e.g. a diffraction grating. The fiducial mark is used for calibration of the alignment sensor 7 and positioning (posture control/adjustment) of the master 1. The fiducial mark is the origin point on the sample stage 5. The X and Y coordinates of the substrate S mounted on the sample stage 5 are coordinates with the fiducial mark support 6 serving as the origin point.

The master stage 2 fixes the master (mold) 1. For instance, the master stage 2 holds the peripheral portion of the master 1 by vacuum suction. Here, the master 1 is formed from a material transmissive to ultraviolet radiation (UV light), such as quartz and fluorite. A transfer pattern made of concave-convex is formed in the master 1. The transfer pattern includes a pattern corresponding to a device pattern, and a pattern corresponding to an alignment mark used for alignment between the master 1 and the substrate S. The master stage 2 is operated so as to position the master 1 at the apparatus fiducial. The master stage 2 is attached to a base portion 11.

To the base portion 11, a correction mechanism 9 (correction means) and a pressurizing unit 10 (pressing means) are attached. The correction mechanism 9 includes an adjustment mechanism for fine-tuning the position (posture) of the master 1. By fine-tuning the position (posture) of the master 1, the correction mechanism 9 corrects the relative position of the master 1 and the substrate S. For instance, the correction mechanism 9 fine-tunes the position of the master 1 under the instruction from the control calculation unit 21.

The pressurizing unit 10 rectifies the strain of the master 1 by applying a stress to the side surface of the master 1. The pressurizing unit 10 pressurizes the master 1 from the four side surfaces toward the center of the master 1. Thus, the size of the transferred pattern is subjected to correction (magnification correction). For instance, the pressurizing unit 10 pressurizes the master 1 with a prescribed stress under the instruction from the control calculation unit 21.

The base portion 11 is attached to the alignment stage 8. The alignment stage 8 moves the base portion 11 in the X-axis direction and the Y-axis direction for alignment between the master 1 and the substrate S. The alignment stage 8 also has the function of rotating the base portion 11 along the XY plane. The direction of rotation along the XY plane is referred to as θ direction.

The alignment sensor 7 detects an alignment mark provided on the master 1 and an alignment mark provided on the substrate S. The master 1 is provided with a first alignment mark (master alignment mark), not shown. On the foundation pattern of the substrate S, a second alignment mark (foundation alignment mark), not shown, is formed. The foundation alignment mark and the master alignment mark are used to measure the relative misalignment between the master 1 and the substrate S. The master alignment mark and the foundation alignment mark are made of e.g. a diffraction grating.

The alignment sensor 7 detects the misalignment of the master 1 with respect to the fiducial mark on the fiducial mark support 6, and the misalignment of the substrate S with respect to the master 1. The position (e.g., X and Y coordinates) of the alignment mark detected by the alignment sensor 7 is sent to the control calculation unit 21. In FIG. 1, only two alignment sensors 7, left and right, are shown. However, preferably, four or more alignment sensors 7 are provided.

The control calculation unit 21 calculates the misalignment of the master 1 with respect to the aforementioned fiducial mark. The misalignment of the master 1 with respect to the aforementioned fiducial mark is detected in the state in which the sample stage 5 is moved by a movement mechanism, not shown, to the position where the aforementioned fiducial mark and the master 1 can be simultaneously detected. The amount of misalignment is obtained by irradiating the aforementioned fiducial mark and the master alignment mark with light by a light source, not shown, and measuring the misalignment based on the barycenter position of the light diffracted and reflected back to the alignment sensor 7.

On the other hand, the misalignment of the substrate S with respect to the master 1 (the relative misalignment between the master 1 and the substrate S) is detected in the state in which the sample stage 5 is moved by the movement mechanism, not shown, to the position where the master alignment mark and the foundation alignment mark opposed to each other can be simultaneously detected. The amount of misalignment is obtained by irradiating the master alignment mark and the foundation alignment mark with light by the light source, not shown, and measuring the relative misalignment based on the barycenter position of the light diffracted and reflected back to the alignment sensor 7.

The control calculation unit 21 generates a signal for controlling the sample stage 5 in the X-axis direction, the Y-axis direction, the Z-axis direction, and the θ direction. The control calculation unit 21 generates a signal for controlling the relative position of the master 1 and the sample stage 5. For instance, the position of the sample stage 5 on the stage platen 13 is controlled by the signal sent from the control calculation unit 21.

The control calculation unit 21 performs calculation for alignment between the master 1 and the substrate S based on the position information of the alignment mark sent from the alignment sensor 7. The alignment stage 8 performs alignment adjustment between the master 1 and the substrate S based on the signal sent from the control calculation unit 21.

The control calculation unit 21 may generate a signal for controlling the correction mechanism 9. In order to cause the pressurizing unit 10 to generate a stress for magnification correction of the master 1, the control calculation unit 21 may provide the pressurizing unit 10 with a signal for generating this stress by a prescribed calculation.

The control calculation unit 21 may control the light source 12. In pattern formation based on imprint, a photosensitive resin (hereinafter simply referred to as "resin") such as ultraviolet curable resin is applied onto the substrate S. Then, with the master 1 brought into contact with the resin, the resin is irradiated with light from the light source 12. The control calculation unit 21 may control the irradiation timing and irradiation amount of this light.

For instance, the light source 12 emits ultraviolet light. For instance, the light source 12 is placed directly above the master 1. However, the position of the light source 12 is not limited to directly above the master 1. In the case where the light source 12 is placed at a position other than directly above the master 1, an optical member such as a mirror can be used to establish an optical path such that the light emitted from the light source 12 is applied toward the master 1 from directly above the master 1.

The pattern formation apparatus 110 includes an application device 14. The application device 14 applies resin onto the substrate S. The application device 14 includes a nozzle and drops resin from this nozzle onto the substrate S.

The pattern formation apparatus 110 forms a pattern in the resin on the substrate S by the imprint method. This pattern is a pattern in which the concave-convex shape of the transfer pattern of the master 1 is transferred. That is, with the resin applied onto the substrate S, the distance in the Z-axis direction between the master 1 and the substrate S is reduced to bring the transfer pattern of the master 1 into contact with the resin. In this state, the resin is cured by irradiation with light from the light source 12. After the resin is cured, the master 1 is removed from the resin. Thus, a pattern in which the concave-convex shape of the transfer pattern of the master 1 is transferred to the resin is formed on the substrate S.

Furthermore, the pattern (resist pattern) of the resin in which the concave-convex shape of the transfer pattern of the master 1 is transferred may be used as a mask to etch a target layer (to-be-processed layer). Thus, the shape of the transfer pattern may be transferred to the target layer.

In the pattern formation apparatus 110, in transferring the shape of the transfer pattern of the master 1 to the substrate S, the relative position of the master 1 and the substrate S is corrected by the correction mechanism 9. In this state, the master 1 located above the substrate S is pressed to the substrate S by the pressurizing unit 10. Thus, pattern transfer is performed with high accuracy.

In the pattern formation apparatus 110 according to this embodiment, alignment between the master 1 and the substrate S described below is performed by the control calculation unit 21. Thus, alignment with high accuracy is performed between the master 1 and the substrate S. In the pattern formation apparatus 110, misalignment of the pattern transferred onto the substrate S is suppressed. Thus, a pattern with high dimensional accuracy is obtained.

Second Embodiment

Next, a pattern formation method is described.

Figure 2A:
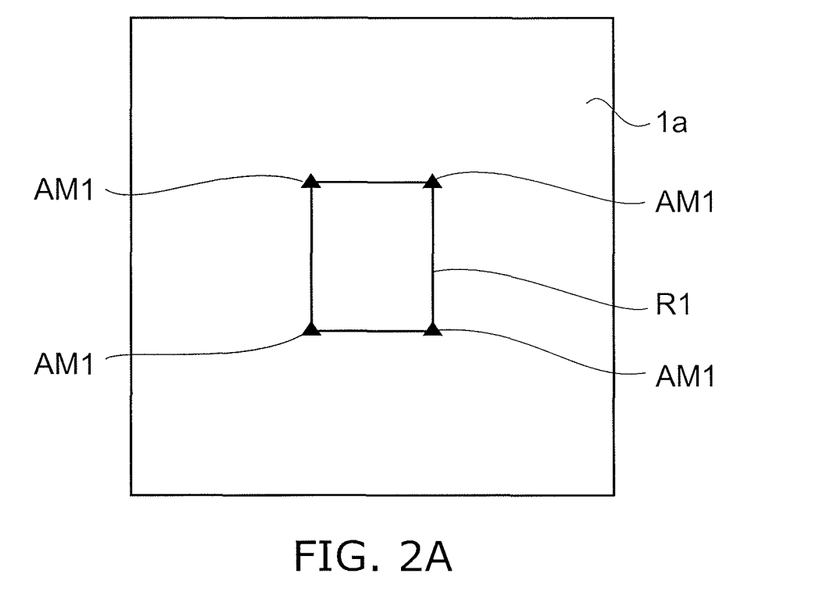
FIGS. 2A and 2B are schematic views illustrating master alignment marks.
Figure 2B:
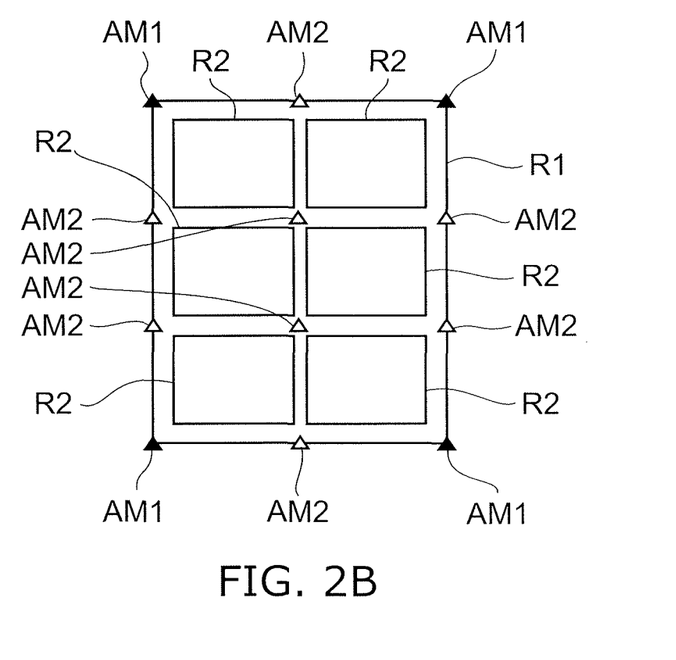

FIGS. 2A and 2B are schematic views illustrating master alignment marks.

FIG. 2A shows alignment marks AM1 (first alignment marks) provided at the four corners of a shot. FIG. 2B shows alignment marks AM2 (second alignment marks) other than the alignment marks AM1.

As shown in FIG. 2A, the master 1 includes a shot region R1 provided in a central portion of a base material 1a. In the shot region R1, a transfer pattern is provided. The shot region R1 is a region for pattern transfer by a single imprint process. The outline of the shot region R1 is rectangular. The alignment marks AM1 are provided at the four corners of the shot region R1.

As shown in FIG. 2B, in the shot region R1, a plurality of chip regions R2 are provided. In the chip regions R2, transfer patterns for a plurality of chips are formed. In the example shown in FIG. 2B, a total of six chip regions R2 are provided in three rows and two columns. The outline of the chip region R2 is rectangular. The alignment mark AM2 is provided at e.g. a corner of the chip region R2.

The pattern formation method according to this embodiment performs alignment between the master 1 and the substrate S using such alignment marks AM1 and AM2. On the substrate S, foundation alignment marks corresponding to the alignment marks AM1 and AM2 are provided.

Figure 3:
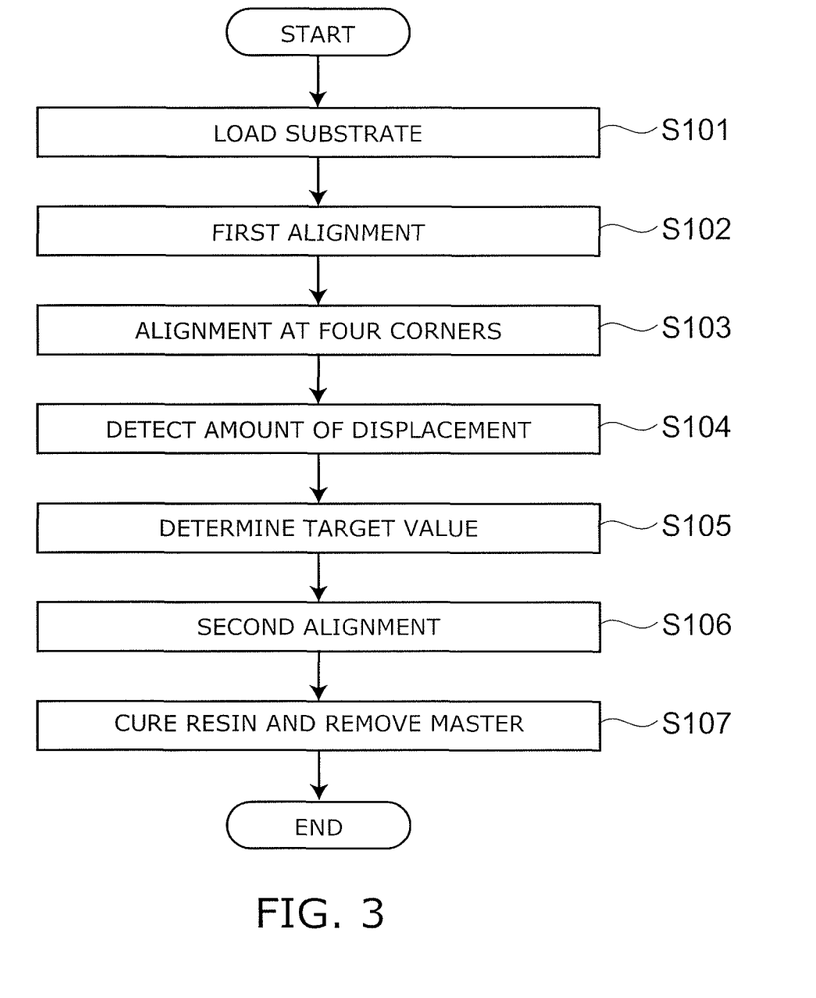
FIG. 3 is a flow chart illustrating the pattern formation method.

FIG. 3 is a flow chart illustrating the pattern formation method.

As shown in FIG. 3, the pattern formation method according to this embodiment includes loading a substrate (step S101), first alignment (step S102), alignment at the four corners (step S103), detecting the amount of displacement (step S104), determining a target value (step S105), second alignment (step S106), and curing the resin and releasing the master (step S107).

In the pattern formation method shown in FIG. 3, an alignment method includes first alignment (step S102), alignment at the four corners (step S103), detecting the amount of displacement (step S104), determining a target value (step S105), and second alignment (step S106).

First, as shown in step S101 of FIG. 3, a substrate S is loaded. The substrate S is transported from outside the pattern formation apparatus 110 onto the sample stage 5. The substrate S is fixed on the chuck 4.

Next, as shown in step S102 of FIG. 3, first alignment is performed. The first alignment performs rough alignment between the master 1 and the substrate S.

Next, as shown in step S103 of FIG. 3, alignment at the four corners of the shot region R1 is performed. More specifically, misalignment between the alignment marks AM1 provided at the four corners of the shot region R1 shown in FIGS. 2A and 2B and the foundation alignment marks corresponding to the alignment marks AM1 is detected by the alignment sensors 7. The detected result is sent to the control calculation unit 21.

The control calculation unit 21 stores the detection result sent from the alignment sensors 7 in a memory unit 22.

Next, as shown in step S104 of FIG. 3, misalignment between the alignment marks AM2 provided at corners of the chip region R2 and the foundation alignment marks corresponding to the alignment marks AM2 is detected by the alignment sensors 7. The control calculation unit 21 stores the detection result sent from the alignment sensors 7 in the memory unit 22.

Next, as shown in step S105 of FIG. 3, a target value is determined. More specifically, based on the detection result of the alignment sensors 7 stored in the memory unit 22, a target value of the amount of movement (target movement amount) of the position of the alignment marks AM1 of the four corners of the shot region R1 with respect to the substrate S is determined.

The target value is calculated by the control calculation unit 21. The control calculation unit 21 calculates the target value using both the amount of misalignment between the alignment marks AM1 and the foundation alignment marks, and the amount of misalignment between the alignment marks AM2 and the foundation alignment marks. The control calculation unit 21 calculates the target value using a prescribed calculation formula so as to minimize all these amounts of misalignment.

Next, as shown in step S106 of FIG. 3, second alignment is performed. The second alignment performs high accuracy alignment between the master 1 and the substrate S. The second alignment fine-tunes the alignment stage 8 by the correction mechanism 9 so that the alignment marks AM1 are matched with the target value calculated by the control calculation unit 21. For instance, the second alignment is performed in parallel with the processing of applying resin onto the substrate S.

Here, the second alignment is performed after the master 1 is pressurized by the pressurizing unit 10 to perform magnification correction for correcting the strain of the master 1.

Next, as shown in step S107 of FIG. 3, curing of the resin and removal of the master are performed. More specifically, after the second alignment is performed, the resin is irradiated with e.g. ultraviolet light. Thus, the resin is cured. Then, the master 1 is removed from the resin. Thus, the concave-convex shape of the transfer pattern of the master 1 is transferred to the resin.

In the pattern formation method as described above, alignment is performed with high accuracy not only at the four corners of the shot region R1 but also inside the shot region R1 (chip regions R2). Thus, a pattern is formed with high accuracy on the substrate S.

If alignment is performed for only the alignment marks AM1 of the four corners of the shot region R1, correction fails to be sufficient inside the shot region R1. To the master 1, a stress is applied from the side surfaces for the purpose of magnification correction. Thus, even if misalignment of the four corners of the shot region R1 is corrected, correction fails to be sufficient for the portion other than the four corners.

In this embodiment, even if magnification correction is performed on the master 1, alignment is performed by considering misalignment not only at the four corners of the shot region R1 but also in the portion other than the four corners. Thus, high accuracy pattern formation is performed throughout the shot.

Next, a specific example of the pattern formation method is described.

Figure 4:
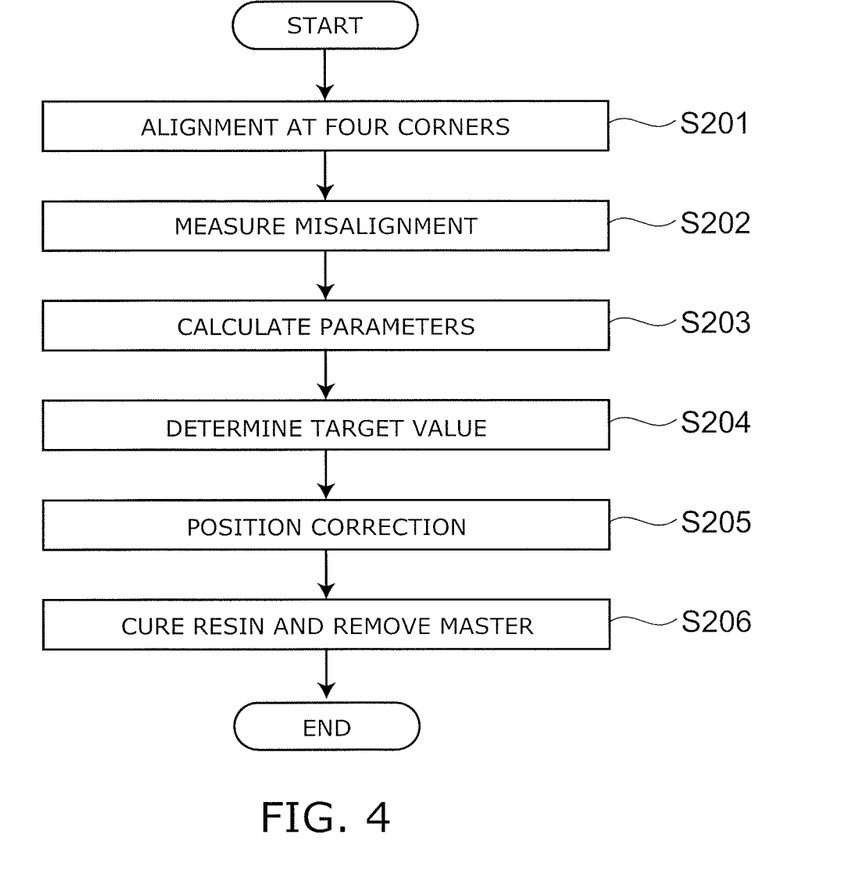
FIG. 4 is a flow chart illustrating a specific example of the pattern formation method.

FIG. 4 is a flow chart illustrating a specific example of the pattern formation method.

In the pattern formation method according to this specific example, alignment between the master 1 and the substrate S is performed before applying resin onto the substrate S.

First, as shown in step S201, alignment is performed using the alignment marks AM1 provided at the four corners of the shot region R1. This specific example uses four alignment marks AM1 provided at the four corners of the shot region R1. However, it is only necessary to use at least three alignment marks AM1. In performing alignment, the position of the alignment mark AM1 is detected by the alignment sensor 7.

Here, the number of alignment sensors 7 is denoted by m, and the number of foundation alignment marks located on the substrate S is denoted by n. Then, in the case of m<n, the alignment sensors 7 are moved to the positions corresponding to the respective foundation alignment marks without moving the master 1 and the substrate S. Thus, misalignment between the foundation alignment marks and the master alignment marks is detected.

Next, as shown in step S202, misalignment is detected using the alignment marks AM2 of other than the four corners of the shot region R1.

Next, as shown in step S203, parameters are calculated based on a correction formula. The detection result of the alignment marks AM1 of the four corners of the shot region R1, and the detection result of the alignment marks AM2 of other than the four corners of the shot region R1, are substituted into one of the following correction formulas (1)-(4).

[Equation 1]

$$dx = k_1 + k_3 x - k_5 y + \alpha_x$$
$$dy = k_2 + k_4 y + k_6 x + \alpha_y \quad (1)$$

[Equation 2]

$$dx = k_1 + k_3 x - k_5 y + k_7 x^2 + k_9 xy + k_{11} y^2 \alpha_x$$
$$dy = k_2 + k_4 y + k_6 x + k_8 y^2 + k_{10} xy + k_{12} x^2 + \alpha_y \quad (2)$$

[Equation 3]

$$dx = k_1 + k_3 x - k_5 y + k_7 x^2 + k_9 xy + k_{11} y^2 + k_{13} x^3 + k_{15} x^2 y + k_{17} xy^2 + k_{19} y^3 + \alpha_x$$
$$dy = k_2 + k_4 y + k_6 x + k_8 y^2 + k_{10} xy + k_{12} x^2 + k_{14} y^3 + k_{16} xy^2 + k_{18} x^2 y + k_{20} x^3 + \alpha_y \quad (3)$$

[Equation 4]

$$dx = k_1 + k_3 x - k_5 y + k_9 xy + \alpha_x$$
$$dy = k_2 + k_4 y + k_6 x + k_{10} xy + \alpha_y \quad (4)$$

In the above correction formulas (1)-(4), dx is the amount of displacement in the X-axis direction in the amount of misalignment. dy is the amount of displacement in the Y-axis direction in the amount of misalignment. $k_1$-$k_{20}$ are parameters. $\alpha_x$ is the residual error in the X-axis direction. $\alpha_y$ is the residual error in the Y-axis direction.

The correction formula (1) is a first order correction formula including six parameters $k_1$-$k_6$. The correction formula (2) is a second order correction formula including twelve parameters $k_1$-$k_{12}$. The correction formula (3) is a third order correction formula including twenty parameters $k_1$-$k_{20}$. The correction formula (4) is a first order correction formula including eight parameters $k_1$-$k_6$, $k_9$, and $k_{10}$.

Among the correction formulas (1)-(4), for the correction formulas (1)-(3), it is determined which of the correction formulas to use based on the number of detected alignment marks AM1 and AM2. On the other hand, in the case where the function of the pattern formation apparatus is limited, the correction formula (4) is used. For instance, the correction formula (4) is used in the case where the alignment correction is limited to at least one of the correction functions of magnification correction, rotation correction, orthogonality correction, and trapezoidal correction. In the case of using the correction formula (4), at least four alignment marks are detected.

Figure 5:
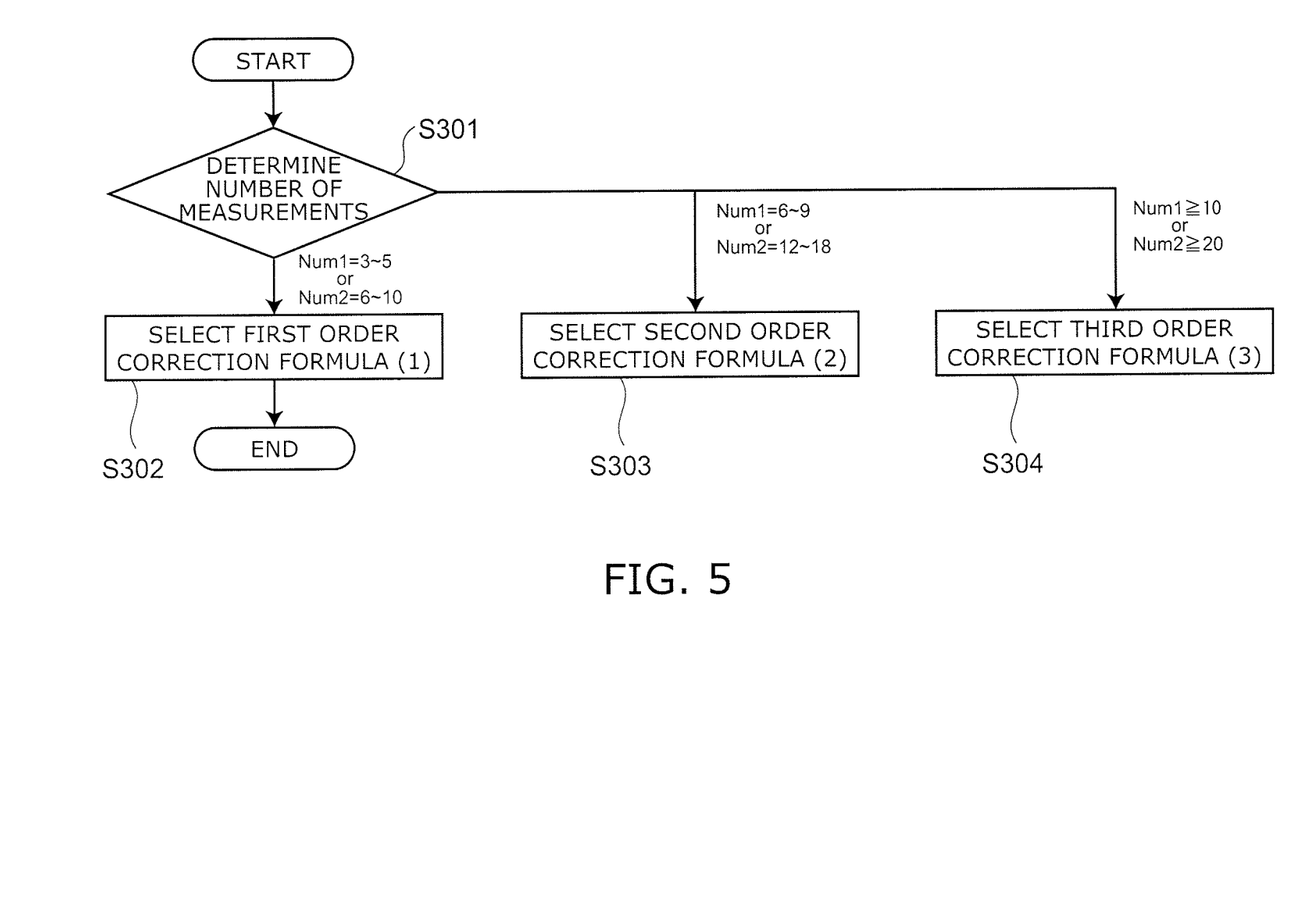
FIG. 5 is a flow chart illustrating the flow of selecting a correction formula.

FIG. 5 is a flow chart illustrating the flow of selecting a correction formula.

First, as shown in step S301 of FIG. 5, the number of measurement results is determined. Here, the number of measurement results refers to the number of measurement results for each pair of one foundation alignment mark and one master alignment mark corresponding thereto. The number of measurement results for the case of measuring both the amount of displacement in the X-axis direction and the amount of displacement in the Y-axis direction at one pair of alignment marks is denoted by Num1. The number of measurement results for the case of separately measuring the amount of displacement in the X-axis direction and the amount of displacement in the Y-axis direction at one pair of alignment marks is denoted by Num2.

If the determination of step S601 indicates that the number of measurement results Num1 is 3 or more and 5 or less, or Num2 is 6 or more and 10 or less, then the flow proceeds to step S302 to select the first order correction formula (1).

If the determination of step S601 indicates that the number of measurement results Num1 is 6 or more and 9 or less, or Num2 is 12 or more and 18 or less, then the flow proceeds to step S303 to select the second order correction formula (2).

If the determination of step S601 indicates that the number of measurement results Num1 is 10 or more, or Num2 is 20 or more, then the flow proceeds to step S304 to select the third order correction formula (3).

Thus, one of the correction formulas (1)-(3) and the correction formula (4) is selected. Then, the selected correction formula is used to calculate the parameters k. More specifically, by substitution into the correction formula for all the measurement points, the values of the parameters k minimizing the residual errors $\alpha_x$ and $\alpha_y$ are calculated.

As an example, for a total of eight master alignment marks, i.e., the alignment marks AM1 of the four corners of the shot region R1 and other four alignment marks AM2, the amounts of misalignment (eight measurement results) with respect to the foundation alignment marks are obtained. The flow of calculation in this case is now described.

In the case where eight measurement results are obtained, based on the flow chart shown in FIG. 5, the correction formula (2) is selected. In the measurement result of the amount of misalignment between one foundation alignment mark and one master alignment mark corresponding thereto, the amount of displacement in the X-axis direction, dx, and the amount of displacement in the Y-axis direction, dy, are substituted into the correction formula (2).

Into x and y of the correction formula (2), for instance, the x coordinate and the y coordinate of the measured master alignment mark are substituted, respectively. Such substitution of the measurement result is performed for all the eight measurement results. Thus, eight equations for dx and eight equations for dy are obtained.

Then, from the eight equations for dx, the parameters $k_1$, $k_3$, $k_5$, $k_7$, $k_9$, and $k_{11}$ minimizing $\alpha_x$ are determined. From the eight equations for dy, the parameters $k_2$, $k_4$, $k_6$, $k_8$, $k_{10}$, and $k_{12}$ minimizing $\alpha_y$ are determined.

Next, as shown in step S204 of FIG. 4, a target value at the four corners of the shot region R1 is determined. More specifically, to the correction formula selected from the correction formulas (1)-(4), the determined parameters k are inputted, and the x and y coordinates of the alignment marks AM1 of the four corners of the shot region R1 are inputted. Then, the obtained values of dx and dy (denoted here by dx' and dy') are multiplied by −1. Thus, the target values (−dx' and −dy') for moving the position of the alignment marks AM1 of the four corners are determined.

Next, as shown in step S205, position correction is performed. The position correction is performed by fine-tuning the position of the master 1 by the correction mechanism 9. Here, fine tuning is performed so that the alignment marks AM1 of the four corners of the shot region R1 are each made close to the target value. This position correction is preferably performed during the time from applying resin onto the substrate S until curing the resin. More preferably, the position correction is performed while applying resin onto the substrate S. This reduces the pattern formation time. In conjunction with this position correction, magnification correction of the master 1 is performed.

Next, after the application of resin is completed, as shown in step S206, the resin is irradiated with e.g. ultraviolet light. Thus, the resin is cured. Then, the master 1 is removed from the resin. On the substrate 5, a resin pattern to which the concave-convex shape of the transfer pattern of the master 1 is transferred is formed.

In the above specific example, the position of the alignment marks AM1 of the four corners of the shot region R1 is first measured, and then the position of the alignment marks AM2 of other than the four corners is measured. However, the position of the alignment marks AM1 of the four corners may be measured after the position of the alignment marks AM2 of other than the four corners is measured.

Before applying resin onto the substrate S, measurement of misalignment at the alignment marks AM1 of the four corners of the shot region R1 and the alignment marks AM2 of other than the four corners only needs to be performed in several shots predetermined in the specification for pattern formation. The position correction shown in step S204 is completed before resin is applied onto the substrate S.

During several shots performed before applying resin onto the substrate S, the parameters k or residual errors a determined for only the alignment marks AM1 of the four corners may be significantly different from the parameters k or residual errors a determined by substitution of all the measurement points. In this case, it is preferable to increase the measurement shots. In the case where the number of measurement shots is increased, measurement may be completed before applying resin onto the substrate S. Alternatively, measurements before and after the application of resin onto the substrate S may be switched.

Besides at the corners of the chip region R2, the alignment marks AM2 of other than the four corners of the shot region R1 may be provided near the center of each side of the shot region R1. Furthermore, the alignment mark AM2 may be provided on the movable shaft of the pressurizing unit 10 for pressing the master 1 for magnification correction of the master 1. In this case, the master stage 2 holds the master 1 so that the alignment mark AM2 is located on the movable shaft of the pressurizing unit 10.

The alignment mark AM2 is preferably provided at locations prone to misalignment and near the position for forming a highly accurate pattern, other than the four corners of the shot region R1. This realizes alignment considering not only the four corners of the shot region R1 but also the portion where correction of misalignment is desired.

By the pattern formation method as described above, for each shot in the imprint method, alignment considering misalignment of not only the four corners but also other than the four corners is performed. Thus, a highly accurate pattern is formed throughout the shot.

Third Embodiment

In the pattern formation method described above, the method for alignment between the master 1 and the substrate S can be realized as a program (alignment program) executed by a computer.

Figure 6:
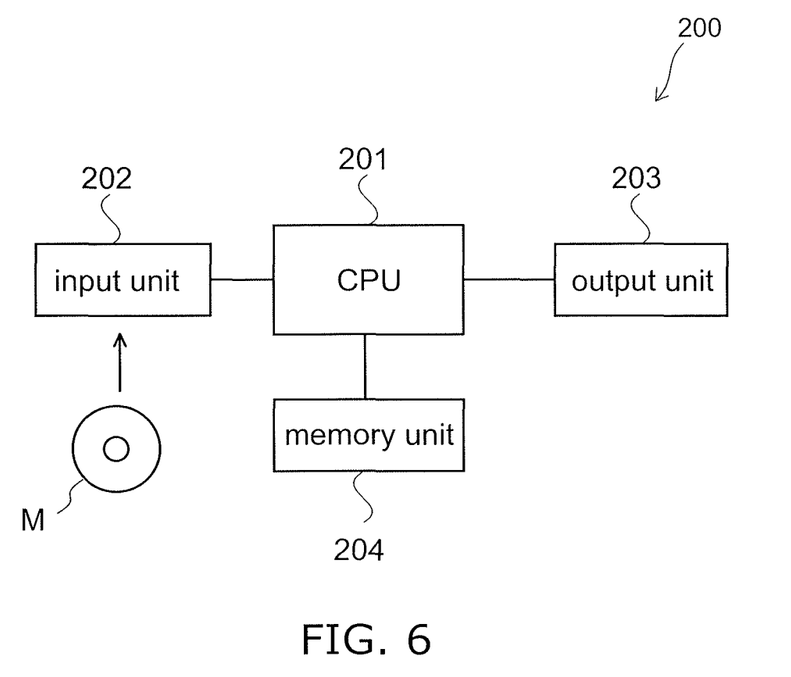
FIG. 6 illustrates a hardware configuration of the computer.

FIG. 6 illustrates a hardware configuration of the computer.

The computer 200 includes a central processing unit 201, an input unit 202, an output unit 203, and a memory unit 204. The input unit 202 includes the function of reading information recorded on a recording medium M. The alignment program is executed in the central processing unit 201.

The alignment program causes the computer 200 to execute first alignment (step S102), alignment at the four corners (step S103), detecting the amount of displacement (step S104), determining a target value (step S105), and second alignment (step S106) shown in FIG. 3.

Fourth Embodiment

The alignment program may be recorded on a computer-readable recording medium. On the recording medium M, first alignment (step S102), alignment at the four corners (step S103), detecting the amount of displacement (step S104), determining a target value (step S105), and second alignment (step S106) shown in FIG. 3 are stored in a format readable by the computer 200. The recording medium M may be a memory device such as a server connected to a network. The alignment program may be distributed through a network.

As described above, the pattern formation method and pattern formation apparatus according to the embodiments can improve alignment between the master and the substrate.

The embodiments have been described above with reference to examples. However, the embodiments are not limited to these examples. For instance, the correction formulas (1)-(4) used to determine a target value are illustrative only, and other correction formulas may be used. Furthermore, those skilled in the art can modify these examples by suitable design change. Such modifications are also encompassed within the scope of the embodiments as long as they fall within the spirit of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern formation method comprising:
   placing a master on a substrate, the master including a concave-convex pattern formed in a rectangular shot region;
   performing alignment between the master and the substrate;

curing a photosensitive resin applied onto the substrate, with the concave-convex pattern of the master brought into contact with the photosensitive resin; and removing the master from the photosensitive resin, the performing alignment including:

measuring amount of misalignment of first alignment marks provided at least three of four corners of the shot region with respect to a fiducial on the substrate, and performing alignment of the four corners of the shot region;

after the alignment of the four corners of the shot region, measuring misalignment of a second alignment mark provided at other than the four corners of the shot region with respect to a fiducial on the substrate;

calculating a target value of amount of movement of the four corners of the shot region so as to minimize the amount of misalignment of the first alignment marks and amount of misalignment of the second alignment mark; and performing alignment between the master and the substrate so that the amount of movement of the four corners of the shot region is made close to the target value.

2. The method according to claim 1, wherein the calculating a target value is performed before applying the photosensitive resin onto the substrate.

3. The method according to claim 1, wherein the performing alignment between the master and the substrate so that the amount of movement of the four corners of the shot region is made close to the target value is performed during time from beginning of applying the photosensitive resin onto the substrate until curing the photosensitive resin.

4. The method according to claim 1, wherein
a plurality of chip regions are provided in the shot region, and
the second alignment mark is provided at corners of the plurality of chip regions.

5. The method according to claim 1, wherein the second alignment mark is provided at center of a side of the shot region.

6. The method according to claim 1, wherein the calculating a target value includes selecting a correction formula of an order, the order depending on number of pairs of the first alignment mark and the second alignment mark.

7. A pattern formation apparatus comprising:
a master stage configured to hold a master, the master including a concave-convex pattern formed in a rectangular shot region;
a sample stage configured to mount a substrate;
a correction mechanism configured to perform alignment between the master and the substrate;
a control calculation unit configured to calculate a target value of alignment between the master and the substrate; and
a light source configured to irradiate with light a photosensitive resin applied onto the substrate, with the concave-convex pattern of the master brought into contact with the photosensitive resin,
the control calculation unit being operative for:
measuring amount of misalignment of first alignment marks provided at least three of four corners of the shot region with respect to a fiducial on the substrate, and instructing the correction mechanism to perform alignment of the four corners of the shot region;
after the alignment of the four corners of the shot region, measuring misalignment of a second alignment mark provided at other than the four corners of the shot region with respect to a fiducial on the substrate;
calculating a target value of amount of movement of the four corners of the shot region so as to minimize the amount of misalignment of the first alignment marks and amount of misalignment of the second alignment mark; and
instructing the correction mechanism to perform alignment between the master and the substrate so that the amount of movement of the four corners of the shot region is made close to the target value.

8. The apparatus according to claim 7, wherein
a plurality of chip regions are provided in the shot region, and
the second alignment mark is provided at corners of the plurality of chip regions.

9. The apparatus according to claim 7, wherein the second alignment mark is provided at center of a side of the shot region.

10. The apparatus according to claim 7, further comprising:
a pressurizing unit configured to apply a stress from periphery toward center of the master.

11. The apparatus according to claim 10, wherein the master stage holds the master so that the second alignment mark is located on a movable shaft of the pressurizing unit.

12. The apparatus according to claim 7, further comprising:
an application device configured to apply a resin onto the substrate.

13. A computer-readable recording medium recorded with an alignment program for performing alignment between a master and a substrate, the master including a concave-convex pattern formed in a rectangular shot region, the alignment program causing a computer to execute:
measuring amount of misalignment of first alignment marks provided at least three of four corners of the shot region with respect to a fiducial on the substrate, and performing alignment of the four corners of the shot region;
after the alignment of the four corners of the shot region, measuring misalignment of a second alignment mark provided at other than the four corners of the shot region with respect to a fiducial on the substrate;
calculating a target value of amount of movement of the four corners of the shot region so as to minimize the amount of misalignment of the first alignment marks and amount of misalignment of the second alignment mark; and
performing alignment between the master and the substrate so that the amount of movement of the four corners of the shot region is made close to the target value.

14. The medium according to claim 13, wherein the calculating a target value includes selecting a correction formula of an order depending on number of pairs of the first alignment mark and the second alignment mark.

* * * * *